United States Patent [19]

Deak et al.

[11] Patent Number: 5,007,842
[45] Date of Patent: Apr. 16, 1991

[54] FLEXIBLE AREA ARRAY CONNECTOR

[75] Inventors: Frederick R. Deak, Kernersville; David B. Wrisley, Jr., Greensboro, both of N.C.

[73] Assignee: AMP Incorporated, Harrisburg, Pa.

[21] Appl. No.: 596,163

[22] Filed: Oct. 11, 1990

[51] Int. Cl.⁵ .............................................. H01R 9/09
[52] U.S. Cl. ...................................... 439/66; 439/77; 439/245; 439/493; 439/591
[58] Field of Search ................... 439/66, 77, 245, 247, 439/248, 493, 591, 840, 65, 67

[56] References Cited

U.S. PATENT DOCUMENTS

| | | | |
|---|---|---|---|
| 3,513,434 | 5/1970 | Zielke | 439/840 |
| 4,029,375 | 6/1977 | Gabrielian | 439/66 |
| 4,057,311 | 11/1977 | Evans | 439/66 |
| 4,173,381 | 11/1979 | Allmark et al. | 439/77 |
| 4,421,370 | 12/1983 | Treakle et al. | 439/66 |
| 4,636,018 | 1/1987 | Stillie | 439/66 |
| 4,820,376 | 4/1989 | Lambert et al. | 439/66 |
| 4,927,369 | 5/1990 | Grabbe et al. | 439/66 |
| 4,934,942 | 6/1990 | Casciotti | 439/493 |

FOREIGN PATENT DOCUMENTS 1542102  3/1979  United Kingdom ................ 439/840

Primary Examiner—Paula A. Bradley
Attorney, Agent, or Firm—Allan B. Osborne

[57] ABSTRACT

An area array connector (10) employs a flexible interconnect member (30) having electrical circuitry including contact pads (32) which are forced into electrical contact with conductive pads (42) and (52) on a pair of stacked substrates (40) and (50) by means of a canted coil spring (24) that is held in a force application plate (20).

5 Claims, 2 Drawing Sheets

FLEXIBLE AREA ARRAY CONNECTOR

FIELD OF THE INVENTION

This invention relates to area array connectors, more particularly to a stacked area array connector having a flexible interconnect member.

BACKGROUND OF THE INVENTION

Electrical connectors of the so-called stacking type are employed in the art to interconnect a pair of substrates having exposed circuit pads. Common among several prior art stacking connectors is the use of coil springs in a force application plate to urge circuit pads into electrical contact, either by direct contact or through intermediary members. For example, Kotaka disclosed in U.S. Pat. No. 3,795,884 the use of an insulating block having coil springs embedded therein so as to extend outwardly from opposed surfaces of the block to engage conductors on parallel printed circuit boards. Later, Balsells in U.S. Pat. No. 4,655,462 taught the use of a coil spring wherein each coil is canted at an acute angle with the centerline of the spring so as to exert a constant force in a loading direction normal to the centerline over a substantial range of deflection.

SUMMARY OF THE INVENTION

In accordance with this invention, an area array connector employs a flexible interconnect member having electrical circuitry including contact pads which are forced into electrical contact with pads on a pair of stacked substrates by means of a canted coil spring that is held in a force application plate.

DESCRIPTION OF THE INVENTION

Figure 1:
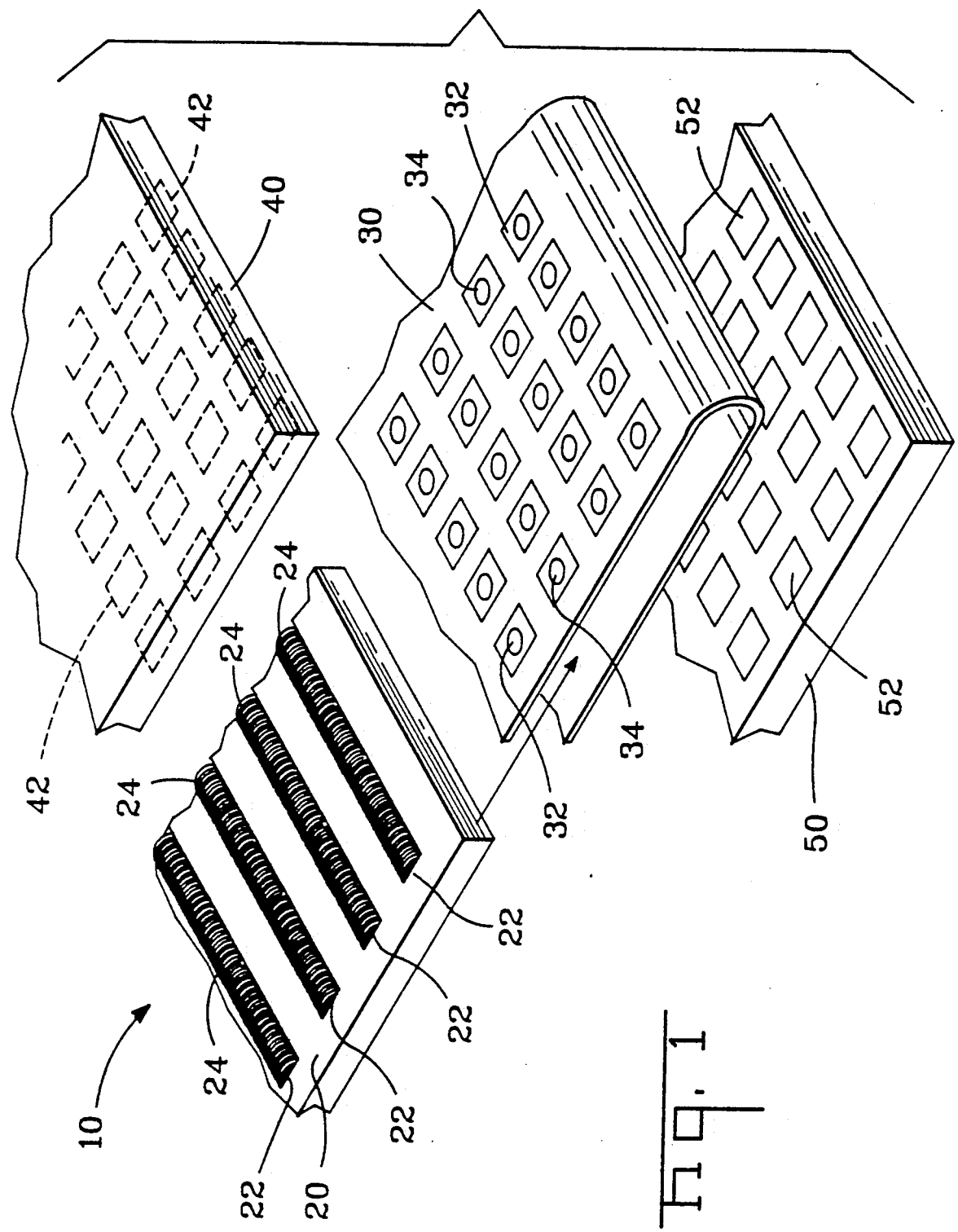
FIG. 1 is a perspective view of an area array connector of this invention with the member parts thereof shown in spaced relationship.
Figure 2:
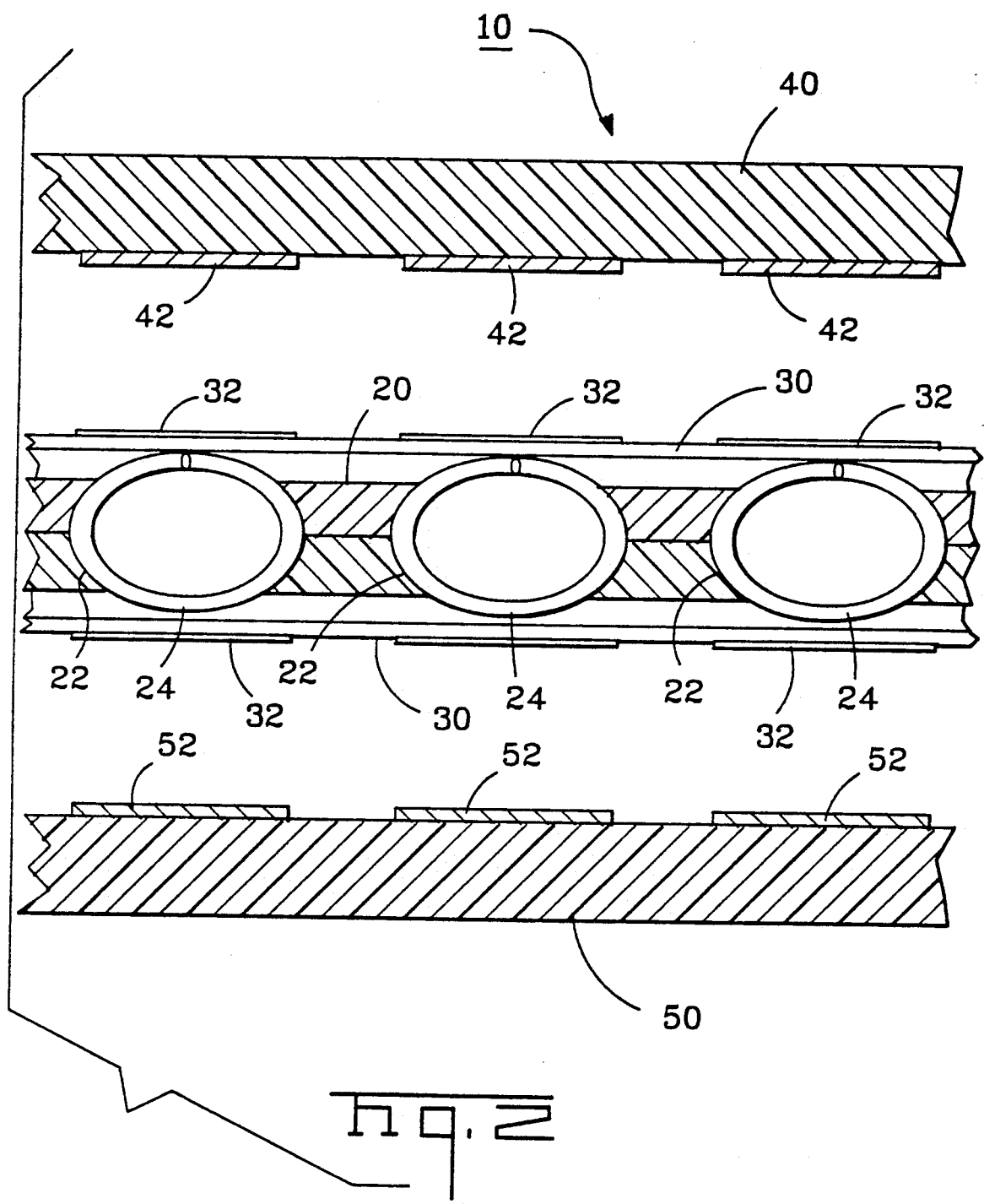
FIG. 2 is a sectional view of the member parts of FIG. 1 in stacked arrangement.

FIGS. 1 and 2 show a stacked area array connector 10 having a force application plate 20 engaged with a flexible interconnect member 30 and located between substrates 40 and 50.

Force application plate 20 has insulative exposed surfaces; either by virtue of plate 20 being of dielectric material or by plate 20 being of conductive material having an overcoat of an insulator such as polytetrafluoroethylene.

Plate 20 has a plurality of slots 22 therethrough with canted coil springs 24 captured within slots 22 to extend beyond both surfaces of the plate. The long axis of springs 24 lies substantially along the long axis of slots 22. Each slot 22 extends substantially the length of plate 20, and is dimensioned to provide a uniform mounting for a spring 24.

Springs 24 are of stainless steel, beryllium copper or other common spring materials that are produced in canted configuration by, among others, Bal Seal Engineering Co.. While canted coil springs are the preferred structure for springs 24, other material having spring-like properties are within the scope of this invention for less demanding embodiments.

Springs 24 are captured within slots 22 by known techniques, such as by heat staking when plate 20 is of a plastic material. Springs 24 may be of a shaped metal alloy which may be heated and collapsed into slots 22 with a zero insertion force. Capture of springs 24 within slots 22 is enhanced by laminating plate 20 and shaping the portion of slot 22 that is within each lamina, as shown in FIG. 2.

Flexible interconnect member 30 [which may be standard or impedance controlled] is made of a pliable insulative film material that is folded into a U-shaped configuration as shown in FIG. 1. Member 30 is provided with a plurality of conductive pads 32 by any of the techniques in common use in the plastic circuitry art, such as by providing film 30 with a metallic coating and thereafter etching away unwanted metallization to leave pads 32. The number and spacing of pads 32 are determined so as to mate with conductive pads on substrates 40 and 50. Pads 32 are preferably provided with thicker portions or bumps 34 in order to enhance the contact between pads 32 and the pads on substrates 40 and 50. It is to be emphasized that film 30 has pads 32 on both its top and bottom outside surfaces; although to avoid introducing confusion in the drawings, only FIG. 2 shows pads 32 on the outside bottom of film 30.

The folded U-shape of film member 30 facilitates establishing standard conductive circuitry that connects a pad 32 on the top surface of film 30 with a pad 32 on the bottom surface. The conductive circuitry may be applied on the inner bight of the U-shape; or in the preferred manner of prior art circuit constructions, film 30 is of laminated strata wherein one layer may carry the vias to the pads and another layer may carry the paths. All types of Controlled Impedance Structures are also possible.

Substrates 40 and 50 that are to be interconnected by the area array connector 10 of this invention may contain any of known circuitry; it being of importance to this invention only that the substrates be provided with surface pads 42 and 52, respectively. Substrates 40 and 50 may be sealed packages or they may be laminated circuit boards, so long as they are provided with contact pads 42 and 52.

In use, the area array connector 10 of this invention is assembled as shown in FIG. 2 with force application plate 20 positioned within U-shaped flexible connector member 30 so that pads 32 overlie springs 24. The assembly of plate 20 and film 30 is positioned between substrates 40 and 50. External pressure applied to force and to clamp substrates 40 and 50 into contact with connector film 30 is augmented by the pressure exerted by springs 24 being distorted and seeking to return to their original configuration. The flexibility of film 30 further serves to compensate for undulations in any of the contacting component parts, especially substrates 40 and 50.

We claim:

1. A flexible area array connector for electrically connecting circuit pads on a pair of spaced substrates, said connector comprising:

a force application plate having a slot therethrough;

a spring member secured within said slot so as to extend beyond both surfaces of said plate;

a flexible interconnect member having conductive pads on a surface thereof;

said flexible member being folded around said force plate so that said conductive pads overlie said spring member on both surfaces of said plate; and said flexible member and said force plate being disposed between substrates so that said conductive pads face circuit pads on the substrates.

2. The connector of claim 1 wherein said force application plate has insulative surfaces, and said flexible member is of insulative material.

3. The connector of claim 1 wherein said force application plate is laminated and the portion of said slot in each lamina is dimensioned to capture said spring when the lamination is completed.

4. The connector of claim 1 wherein said spring member is a canted coil spring having its long axis lying substantially along the long axis of said slot.

5. The connector of claim 1 wherein said conductive pads on said flexible member are interconnected by circuitry carried by said flexible member.

* * * * *